(12) United States Patent
Burger et al.

(10) Patent No.: US 6,721,912 B2
(45) Date of Patent: Apr. 13, 2004

(54) DATA CARRIER MODULE HAVING INDICATION MEANS FOR INDICATING THE RESULT OF A TEST OPERATION

(75) Inventors: Thomas Burger, Graz (AT); Michael Cernusca, Judendorf (AT)

(73) Assignee: Koninklijke Philips Electronics N.V., Eindhoven (NL)

( * ) Notice: Subject to any disclaimer, the term of this patent is extended or adjusted under 35 U.S.C. 154(b) by 378 days.

(21) Appl. No.: 09/864,143

(22) Filed: May 24, 2001

(65) Prior Publication Data

US 2002/0000812 A1 Jan. 3, 2002

(30) Foreign Application Priority Data

May 29, 2000 (EP) ............................................. 00890171

(51) Int. Cl.[7] .............................................. G01R 31/28
(52) U.S. Cl. ....................................... 714/733; 714/724
(58) Field of Search ........................... 714/7, 724, 733, 714/742; 324/760, 765

(56) References Cited

U.S. PATENT DOCUMENTS

| | | | |
|---|---|---|---|
| 5,673,028 A | | 9/1997 | Levy ........................... 340/635 |
| 6,085,334 A | * | 7/2000 | Giles et al. ...................... 714/7 |
| 6,114,866 A | * | 9/2000 | Matsuo et al. ............... 324/760 |
| 6,448,802 B1 | * | 9/2002 | Hirt ............................ 324/765 |

FOREIGN PATENT DOCUMENTS

WO     0011485 A1     3/2000

* cited by examiner

*Primary Examiner*—David Ton
(74) *Attorney, Agent, or Firm*—Kevin Simons

(57) ABSTRACT

A module (2) for a data carrier (1) includes an integrated circuit device (9) and transmission means (10), and the module (2) can be tested with the aid of test means (19) during a test operation, which test means (19) can generate a test-result signal (TRS2, TRS3) in dependence on a test result thus determined, indication means (22), which are electrically switchable to a given indication mode ("1", "0") in dependence on the test-result signal (TRS2, TRS3), which indication means (22) are advantageously arranged directly on the module (2).

10 Claims, 1 Drawing Sheet

US 6,721,912 B2

DATA CARRIER MODULE HAVING INDICATION MEANS FOR INDICATING THE RESULT OF A TEST OPERATION

BACKGROUND

The invention relates to a module for a data carrier adapted to communicate with a communication station, which module includes an integrated circuit device and transmission means, which are connected to the integrated circuit device in an electrically conductive manner, and which module can be tested with the aid of test means during a test operation, which test means can generate a test-result signal in dependence on a test result thus determined, indication means, which are electrically switchable between at least two indication modes, being switchable to a given indication mode in dependence on the test-result signal.

The invention further relates to a data carrier adapted to communicate with a communication station and including a module, which module includes an integrated circuit device and transmission means, which are connected to the integrated circuit device in an electrically conductive manner, and which module can be tested with the aid of test means during a test operation, which test means can generate a test-result signal in dependence on a test result thus determined, indication means, which are electrically switchable between at least two indication modes, being switchable to a given indication mode in dependence on the test-result signal.

Such a module of the type defined in the opening paragraph and such a data carrier of the type defined in the second paragraph are known from the patent document WO 00/11485 A1.

With the known module a test operation can be performed with the aid of a test device, which test device can determine a test result and can generate a test result signal in accordance with this result and which test device includes indication means in the form of display means by means of which it is possible to indicate a test result in a visually perceptible manner. In connection with such a test device as described in the patent document WO 00/11485 A1 it is long known not only to display the test result determined each time but also to mark each module tested using the test result determined by means of the test device, which marking is effected, for example, in such a manner that a test module that has not passed the test operation performed is provided with an optically perceptible mark, for example a color dot. Procedures such as notching or marking with print, require additional cost in order to mark a tested module, because these marks have to applied in a separate operation, which involves undesired extra cost and may also lead to a longer cycle time in automatic production.

SUMMARY OF THE INVENTION

It is an object of the invention to preclude the aforementioned problems and to provide an improved module as well as an improved data carrier.

In order to achieve the aforementioned object, according to the invention, a module of the type defined in the opening paragraph is characterized in that the indication means are provided on the module.

In order to achieve the aforementioned object, according to the invention, a data carrier of the type defined in the second paragraph is characterized in that the indication means are arranged on the module.

By applying the measures in accordance with the invention both an improved module and an improved data carrier are obtained. With a module in accordance with the invention and a data carrier in accordance with the invention it is achieved in a very simple and very cheap manner that after a test operation performed on a module in accordance with the invention a marking indicative of the result of the test operation can be obtained directly on the tested module without any separate operation, no additional means external to the module being required in order to obtain this marking.

With a module in accordance with the invention and with a data carrier in accordance with the invention it has proved to be very advantageous when the indication means are formed by display means. In this respect it has proved to be particularly advantageous when the display means perform their display function with the aid of an electronic substance.

With a module in accordance with the invention and with a data carrier in accordance with the invention it has further proved to be very advantageous when the indication means are formed by a memory area of memory means of the module which are available anyway. In this respect it has proved to be particularly advantageous when the memory means are formed by a semiconductor memory and when the semiconductor memory is incorporated directly in the integrated circuit device of the module.

With a module in accordance with the invention and with a data carrier in accordance with the invention it has proved to be very advantageous when the module is adapted to carry out a self-testing operation.

The aforementioned as well as further aspects of the invention will become apparent from the embodiments described hereinafter by way of example and will be elucidated with reference to these embodiments.

BRIEF DESCRIPTION OF DRAWINGS

The invention will now be described in more detail with reference to the drawings, which show three embodiments given by way of example but to which the invention is not limited.

DETAILED DESCRIPTION

Figure 1:
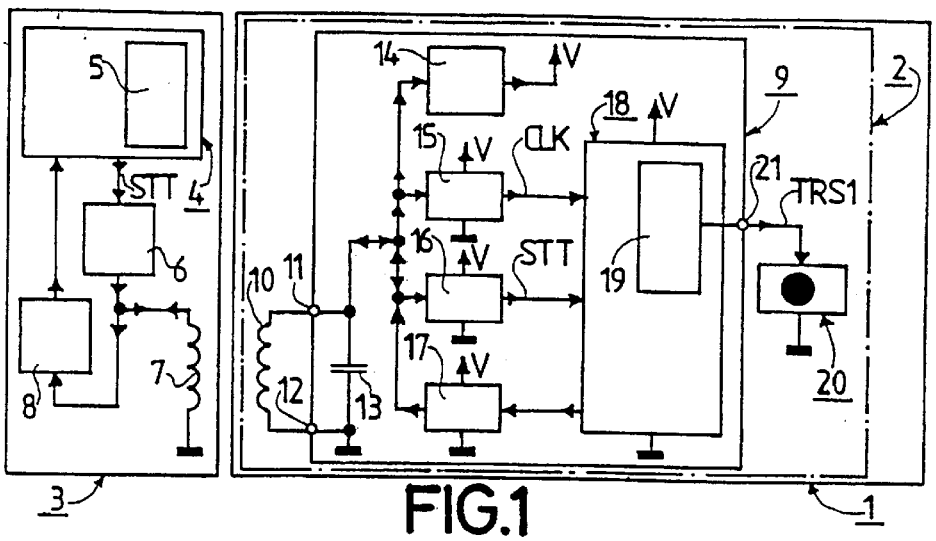
FIG. 1 is a block diagram which diagrammatically shows a data carrier in accordance with a first embodiment of the invention, which includes a module in accordance with a first embodiment of the invention.

FIG. 1 shows a data carrier 1 including a module 2 shown in dash-dot lines in FIG. 1. The data carrier 1 and its module 2 are adapted to communicate with a communication station 3. In the present case the data carrier 1 and the communication station 3 are adapted to communicate in a contactless fashion.

The communication station 3 includes signal processing means 4, which partly take the form of data processing means. The signal processing means 4 are for the greater part realized by means of a microcomputer. The signal processing means 4 are used to realize not only a multitude of means and functions but also command generating means 5. The command generating means 5 can generate, inter alia, a command STT, by means of which a test operation in the module 2 of the data carrier 1 can be started.

The communication station 3 further includes modulation means 6, with the aid of which applied signals can be subjected to a modulation, in the present case an amplitude modulation, upon which the modulation means 6 supply an amplitude-modulated signal to a transmission coil 7. With the aid of the transmission coil 7 of the communication station 3 an amplitude-modulated signal can be transmitted to the data carrier 1 in a contactless manner. Instead of an amplitude modulation a frequency modulation may be applied.

Signals which are likewise transmitted from the data carrier 1 to the transmission coil 7 of the communication station 3 in a contactless manner and which are likewise modulated, in the present case by a so-called load modulation, can be applied from the transmission coil 7 to a demodulation means 8, which demodulate the received load-modulated signals and after the demodulation supply demodulated signals to the signal processing means 4.

The module 2 of the data carrier 1 includes an integrated circuit device 9 and a transmission coil 10, which forms a transmission means and which is connected to the integrated circuit device 9 in an electrically conductive manner in that the transmission coil 10 is connected to two terminals 11 and 12 of the integrated circuit device 9. Between the two terminals 11 and 12 a capacitor 13 is formed internally in the integrated circuit device 9, which capacitor in conjunction with the transmission coil 10 forms a parallel resonant circuit tuned to an operating frequency, which corresponds to the frequency of the carrier signal that has been amplitude-modulated by the amplitude modulation means 6.

Supply voltage generating means 14 and clock signal regenerating means 15 as well as demodulation means 16 and modulation means 17 are connected to the transmission coil 10, i.e. to the parallel resonant circuit formed by the transmission coil 10 and the capacitor 13. With the aid of the supply voltage generating means 14 a supply voltage V can be generated from the signal supplied by the transmission coil 10, which voltage is applied to all the parts of the integrated circuit device 9 which require this supply voltage V. The clock signal regenerating means 15 enable a clock signal CLK to be regenerated from the signal supplied by the transmission coil 10. A signal supplied by the transmission coil 10 can be demodulated with the aid of the demodulation means 16, which signal may be for example the amplitude-modulated signal representing the command STT, so that in the present case the demodulation means 16 supply a signal representing the command STT. A signal applied to the modulation means 17 can be subjected to a modulation with the aid of the modulation means 17, i.e. the load modulation already mentioned hereinbefore, upon which the modulation means 17 supply a load-modulated signal to the transmission coil 10, which transmits the load-modulated signal to the transmission coil 7 of the communication station 3 in a contactless manner.

The integrated circuit device further includes data processing means 18, which are essentially formed with the aid of a microcomputer. The data processing means 18 are arranged to receive the regenerated clock signal CLK. The data processing means 18 are further arranged to receive the signals demodulated with the aid of the demodulation means 16, i.e. also the signal representing the command STT. The data processing means 18 can also generate signals, for example digital signals, representing an answer of the data carrier 1 to the communication station 3. These signals generated by the data processing means 18 can be applied from the data processing means 18 to the modulation means 17 in order to modulate said signals.

The multitude of further means and functions realized with the aid of the data processing means 18 include inter alia test means 19, which in the present case are self-test means 19, which can be activated by means of the command STT, in order to carry out a self-test. During a test operation the module 2 can be tested by the test means 19. The test means 19 can then generate a test-result signal TRS1 depending on a test result thus determined. In the present case, the test-result signal TRS1 is generated when a negative test result is established during the test operation with the aid of the test means 19, i.e. during the self-test operation with the aid of the self-test means 19 incorporated in the integrated circuit device 9, i.e. when it is established that the module 2 is not in good working order.

The data carrier 1 and its module 2 are advantageously devised in such a manner that the module 2 includes indication means which are electrically switchable between at least two indication modes and which can be set to an indication mode in dependence on the test-result signal TRS1. The test-result signal TRS1 is applied directly to the indication means 20 in the module 2 shown in FIG. 1, which is effected via an output 21 of the integrated circuit device 9. In the present case, the indication means 20 are formed by display means 20, which can be set to a given display mode in dependence on the test-result signal TRS1 applied to it. The display means 20 include an electrochemical substance, which is switchable to a given color mode in dependence on the test-result signal TRS1 applied to the display means 20. In the present case, the implementation is such that in the case that the self-test means 19 supply the test-result signal TRS1 the electrochemical substance in the display means is driven into a red color mode, which is irreversible, as a result of which the negative test result is indicated, i.e. displayed, as a red color dot.

Figure 2:
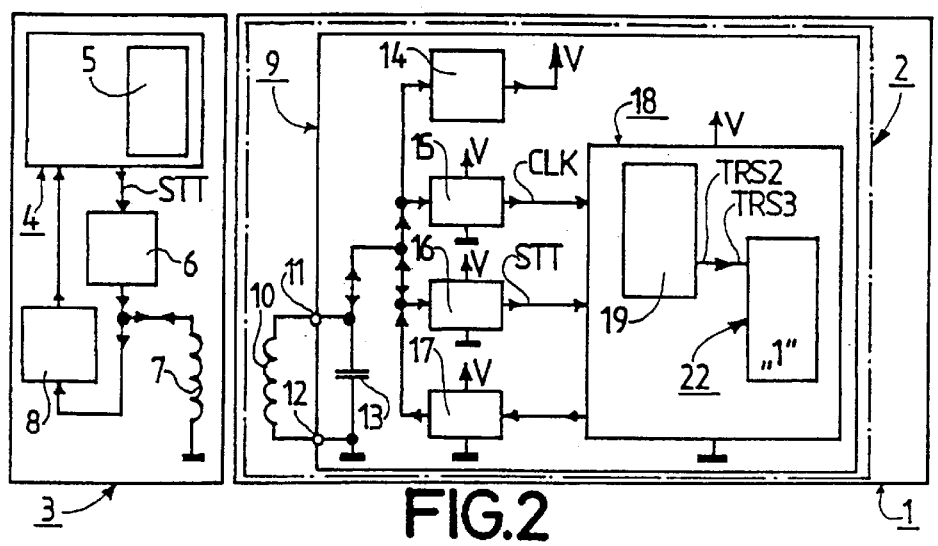
FIG. 2 shows, in a manner similar to FIG. 1, a data carrier in accordance with a second embodiment of the invention, which includes a module in accordance with a second embodiment of the invention.

FIG. 2 shows a data carrier 1 and a communication station 3, the communication station 3 being identical to the communication station 3 shown in FIG. 1. The data carrier 1 shown in FIG. 2 differs from the data carrier 1 shown in FIG. 1 in that other indications means 22 are provided.

The indications means 22 of the data carrier 1 shown in FIG. 2 and of its module 2 are also arranged directly on the module 2 but in the present case they are formed by a memory area of memory means 22 of the module 2, the memory means 22 being formed by a semiconductor memory incorporated in the integrated circuit device 9 of the module 2.

The data carrier 1 and the module 2 shown in FIG. 2 are devised in such a manner that, in the case that the self-test means 19 establish a negative test result, the self-test means 19 supply a first test-result signal TRS2 to the memory means 22, which first test-result signal TRS2 causes the value "1" to be stored in the appropriate memory area provided, as is indicated in FIG. 2. In the case that the self-test means 19 establish a positive test result, the self-test means 19 supply a second test-result signal TRS3, which is applied to the memory means 22 and which causes the value "0" instead of the value "1" to be stored in the appropriate memory area of the memory means 22, which is not indicated in FIG. 2. In the present case, the two values "1" and "0" represent two indication states, which can be evaluated during a subsequent use of the tested module 2 or the tested data carrier 1.

Figure 3:
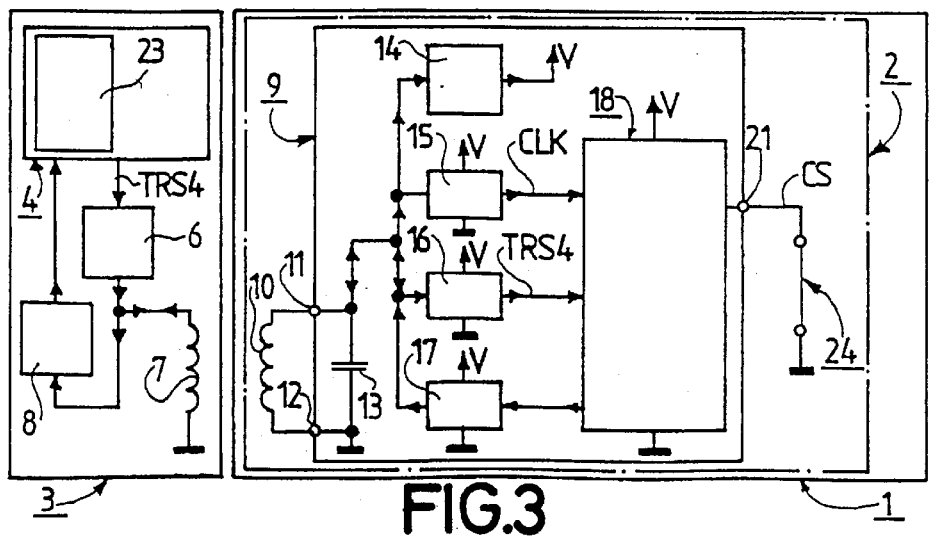
FIG. 3 shows, in a manner similar to FIGS. 1 and 2, a data carrier in accordance with a third embodiment of the invention, which includes a module in accordance with a third embodiment of the invention.

FIG. 3 shows a further data carrier 1 in accordance with the invention and a further communication station 3. The communication station 3 shown in FIG. 3 differs from the communication station 3 shown in FIGS. 1 and 2 in that test means 23 are realized with the aid of the signal processing means 4. With the aid of the test means 23 the data carrier 1 can be tested during a test operation. It is emphasized that such a test operation may already be carried out at an instant at which the module 2 has not yet been incorporated in the data carrier 1, which has the advantage that a module 2 that appears not be in good working order during the test operation is actually not incorporated in a data carrier 1. The test means 23 can generate a test-result signal TRS4 in dependence on a test result found. This test-result signal TRS4 is generated when a test performed on the module 4 yields a positive test result. The test-result signal TRS4 can be applied from the signal processing means 4 to the modulation means 6 and can subsequently be transmitted in amplitude-modulated form to the transmission coil 10 of the module 2 with the aid of the transmission coil 7 of the communication station 3. With the aid of the demodulation means 16 of the module 2 a signal corresponding to the test-result signal TRS4 is generated, which is applied to the data processing means 18. The data processing means 18 evaluate the test-result signal TRS4. In response to the detection of the test-result signal TRS4 the data processing means 18 produce a control signal CS on the output 21 of the integrated circuit device 9. The output 21 is connected to indication means 24, which in the present case are formed as a fusible conductive connection 24. The connection 24 is electrically switchable between at least two indication states and, in dependence on the test-result signal TRS4 and, consequently, in dependence on the control signal CS applied to it, it can be brought into its melted, i.e. its non-conductive state, which non-conductive state forms one of the two possible indication states, the other indication state being the conductive state.

In each of the three data carriers 1 and each module 2 of these three data carriers 1 it is achieved in a very simple and economical manner that an indication representing the result of a test operation that has been carried out can be realized directly on the tested module 2 without any separate mechanical operation. For each of the three modules 2 of the three data carriers 1 described hereinbefore a test operation can be carried out both while the module 2 has not yet been incorporated in a data carrier 1 and while the module has already been incorporated in a data carrier 1.

The measures in accordance with the invention can also be applied with advantage to modules for data carriers for contact-bound communication.

What is claimed is:

1. A module for a data carrier adapted to communicate with a communication station, comprising:
    an integrated circuit device a transmission coils, which is connected to the module in an electrically conductive manner;
    test means that are adapted to test the module during a test operation, wherein the test means are also adapted to generate a test-result signal in dependence on a test result;
    indication means, which are electrically switchable between at least two indication modes, and which are switchable to a given indication mode in dependence on the test-result signal, wherein the indication means are arranged on the module and are formed by display means which are switchable to a given display mode in dependence on the test-result signal, and the display means include an electrochemical substance that is switchable to a given color mode in dependence on the test-result signal.

2. A module as claimed in claim 1, wherein the indication means are formed by a memory area of a memory means of the module.

3. A module as claimed in claim 2, wherein the memory means comprise a semiconductor memory.

4. A module as claimed in 3, wherein the semiconductor memory is incorporated in the integrated circuit device of the module.

5. A module as claimed in claim 1, wherein the integrated circuit device of the module is adapted to carry out a self-test operation with the aid of a self-test means included in the integrated circuit device, and the self-test means are connected to the indication means so as to apply a relevant self-test result signal to the indication means.

6. A data carrier adapted to communicate with a communication station, comprising:
    a module, which includes an integrated circuit device that communicates with the integrated circuit device in an electrically conductive manner, wherein the module is adapted for testing using a test means during a test operation and the test means is adapted to generate a test-result signal depending on a test result thus determined;
    indication means, which are electrically switchable between at least two indication modes, being switchable to a given indication mode in dependence on the test-result signal, wherein the indication means are arranged on the module and formed by display means are switchable to a given display mode in dependence on the test-result signal, wherein the display means include an electrochemical substance and that is switchable to a given color mode in dependence on the test-result signal.

7. A data carrier as claimed in claim 6, wherein the indication means are formed by a semiconductor memory.

8. A data carrier as claimed in claim 7, wherein the memory means are formed by a semiconductor memory.

9. A data carrier as claimed in claim 8, wherein the semiconductor memory is incorporated in the integrated circuit device of the module.

10. A data carrier as claimed in claim 6, wherein the integrated circuit device of the module is adapted to carry out a self-test operation with the aid of self-test means included in the integrated circuit device, and the self-test means are connected to the indication means so as to apply the relevant self-test result signal to the indication means.

* * * * *